US010121782B2

(12) United States Patent
Apodaca et al.

(10) Patent No.: US 10,121,782 B2
(45) Date of Patent: Nov. 6, 2018

(54) 3D CROSS-POINT MEMORY MANUFACTURING PROCESS HAVING LIMITED LITHOGRAPHY STEPS

(71) Applicant: Western Digital Technologies, Inc., San Jose, CA (US)

(72) Inventors: Mac D. Apodaca, San Jose, CA (US); Daniel Robert Shepard, North Hampton, NH (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/629,152

(22) Filed: Jun. 21, 2017

(65) Prior Publication Data

US 2017/0287907 A1 Oct. 5, 2017

Related U.S. Application Data

(62) Division of application No. 15/080,525, filed on Mar. 24, 2016, now Pat. No. 9,735,151.

(51) Int. Cl.
*H01L 27/06* (2006.01)
*H01L 29/06* (2006.01)
(Continued)

(52) U.S. Cl.
CPC ........ *H01L 27/0688* (2013.01); *H01L 23/528* (2013.01); *H01L 23/5226* (2013.01);
(Continued)

(58) Field of Classification Search
CPC ............ H01L 27/0688; H01L 21/3065; H01L 23/528; H01L 23/5226; H01L 23/53257;
(Continued)

(56) References Cited

U.S. PATENT DOCUMENTS 8,394,716 B2 3/2013 Hwang et al.
8,497,533 B2 7/2013 Hyun et al.
(Continued)

OTHER PUBLICATIONS

Apodaca, et al., Notice of Allowance dated Apr. 12, 2017 for U.S. Appl. No. 15/080,525.
(Continued)

*Primary Examiner* — Thanh Y Tran
(74) *Attorney, Agent, or Firm* — Stoel Rives LLP

(57) ABSTRACT

The present disclosure generally relates to semiconductor manufactured memory devices and methods of manufacture thereof. More specifically, methods for forming a plurality of layers of a 3D cross-point memory array without the need for lithographic patterning at each layer are disclosed. The method includes depositing a patterned hard mask with a plurality of first trenches over a plurality of layers. Each of the plurality of first trenches is etched all the way through the plurality of layers. Then the hard mask is patterned with a plurality of second trenches, which runs orthogonal to the plurality of first trenches. Selective undercut etching is then used to remove each of the plurality of layers except the orthogonal metal layers from the plurality of second trenches, resulting in a 3D cross-point array with memory material only at the intersections of the orthogonal metal layers.

20 Claims, 17 Drawing Sheets

(51) Int. Cl.
*H01L 23/528* (2006.01)
*H01L 23/522* (2006.01)
*H01L 23/532* (2006.01)
*H01L 27/10* (2006.01)
*H01L 49/02* (2006.01)

(52) U.S. Cl.
CPC .. *H01L 23/53257* (2013.01); *H01L 23/53261* (2013.01); *H01L 27/101* (2013.01); *H01L 28/00* (2013.01); *H01L 29/0649* (2013.01)

(58) Field of Classification Search
CPC ............ H01L 29/0649; H01L 21/3081; H01L 21/3212; H01L 21/32133; H01L 21/31116; H01L 23/53261
See application file for complete search history.

(56) References Cited

U.S. PATENT DOCUMENTS

| | | |
|---|---|---|
| 8,614,511 B2 | 12/2013 | Choi et al. |
| 8,829,646 B2 | 9/2014 | Lung et al. |
| 9,082,826 B2 | 7/2015 | Chandrashekar et al. |
| 2010/0237320 A1 | 9/2010 | Nagashima |
| 2013/0168757 A1 | 7/2013 | Hong |
| 2014/0175371 A1 | 6/2014 | Karpov et al. |
| 2014/0203237 A1 | 7/2014 | Chien et al. |
| 2014/0346428 A1 | 11/2014 | Sills et al. |
| 2015/0179659 A1 | 6/2015 | Takaki |
| 2015/0325585 A1* | 11/2015 | Peng ................. H01L 27/11568 257/324 |
| 2016/0118442 A1 | 4/2016 | Kim et al. |
| 2016/0218147 A1 | 7/2016 | Shepard |

OTHER PUBLICATIONS

Apodaca, et al., Office Action dated Jan. 27, 2017 for U.S. Appl. No. 15/080,525.
Apodaca, et al., Office Action dated Jun. 11, 2018 for U.S. Appl. No. 15/628,317.

* cited by examiner

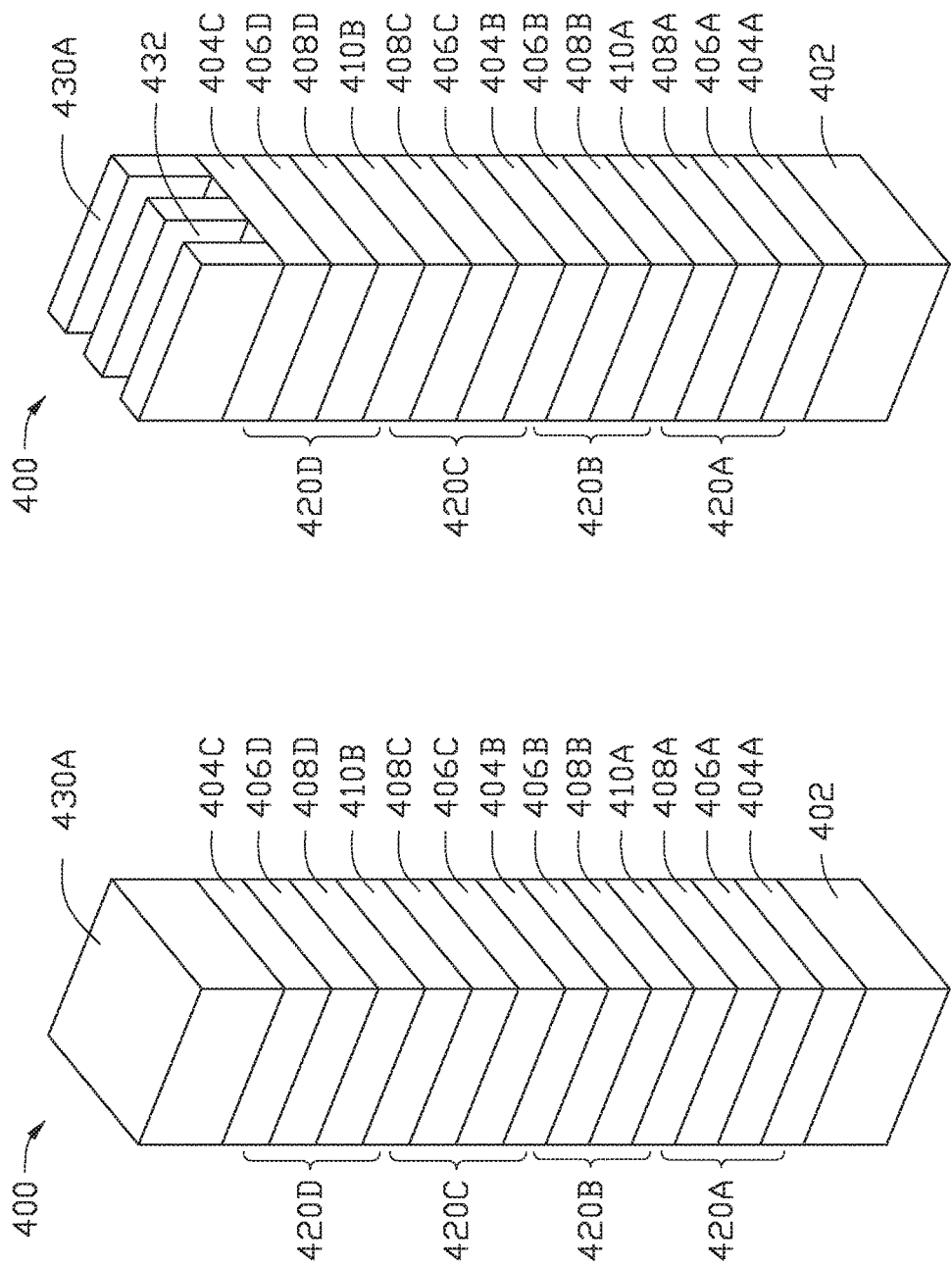

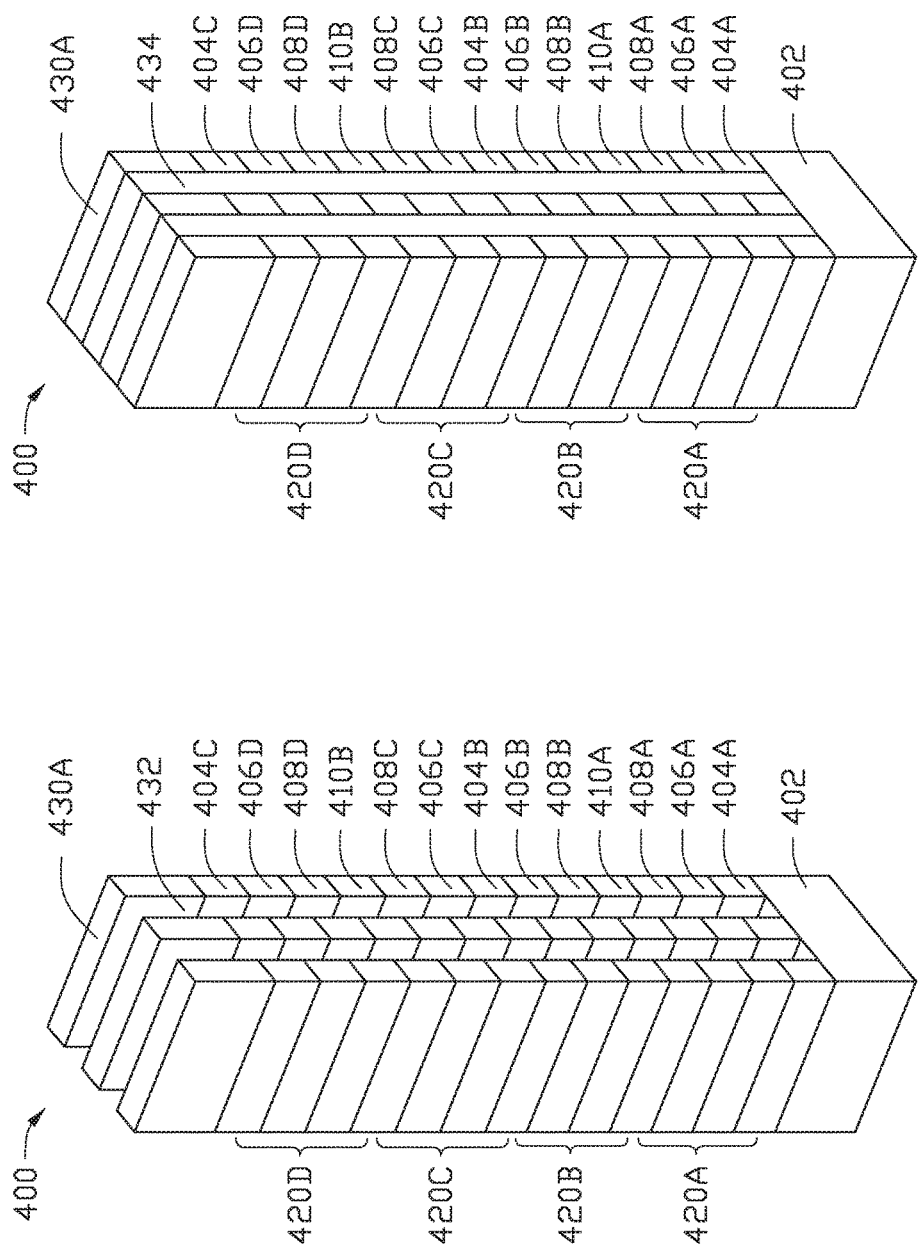

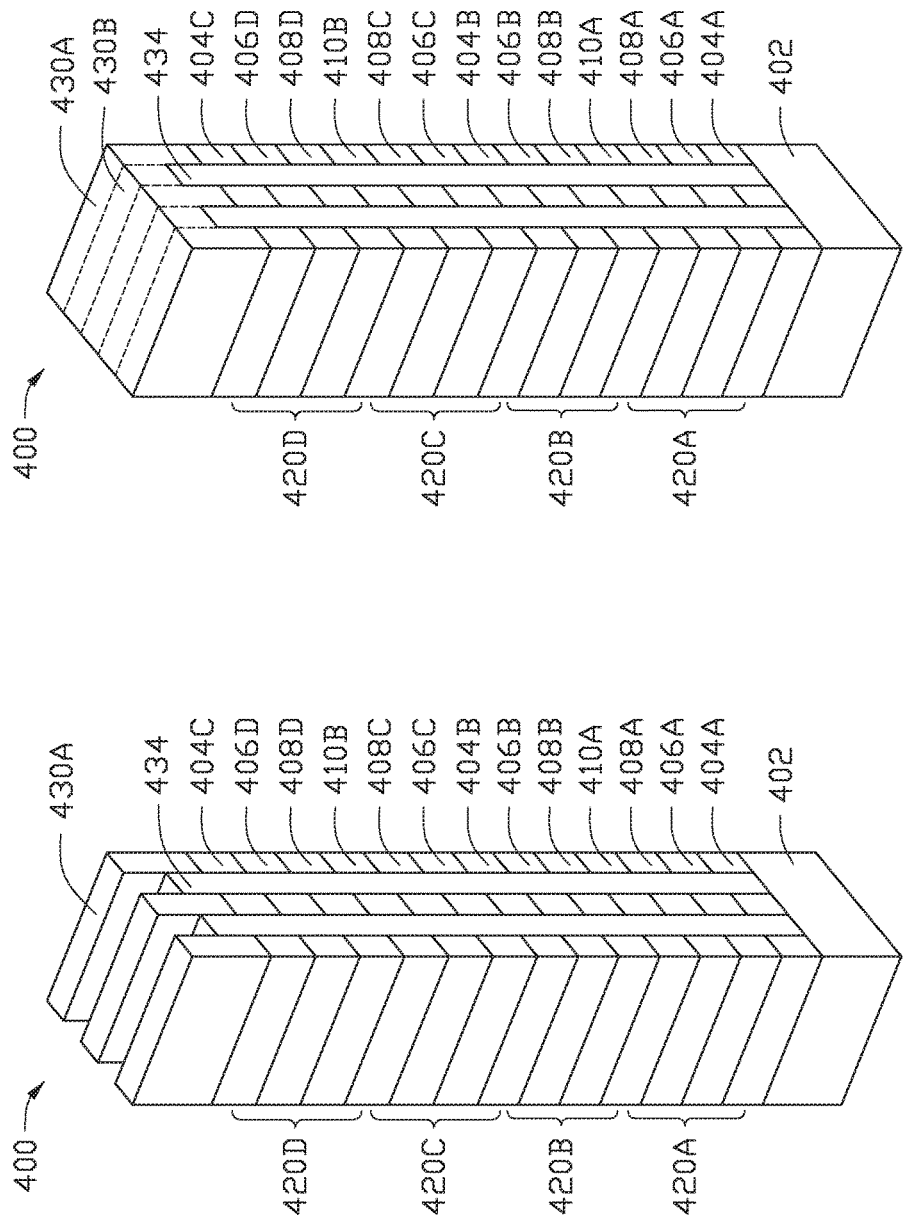

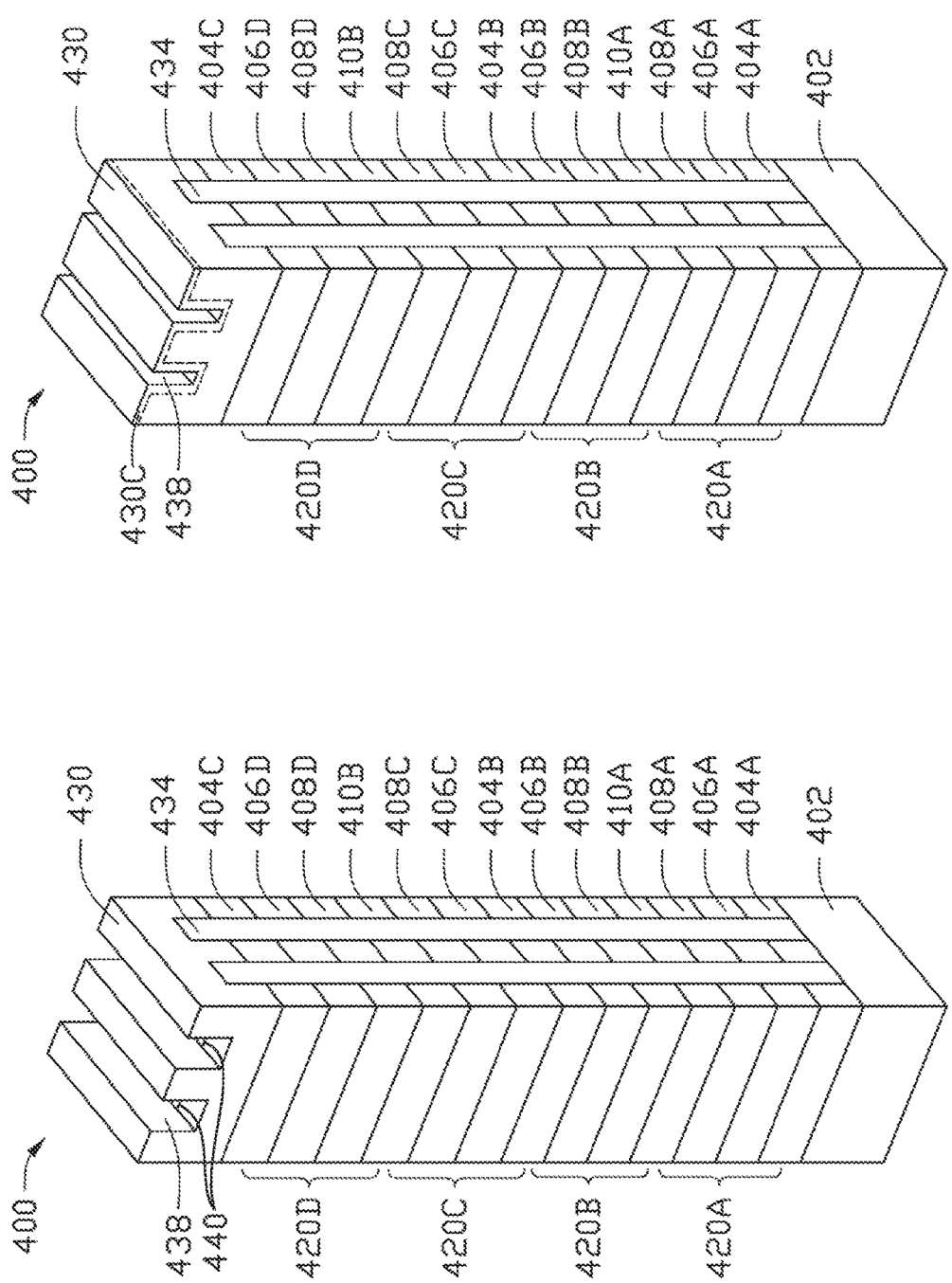

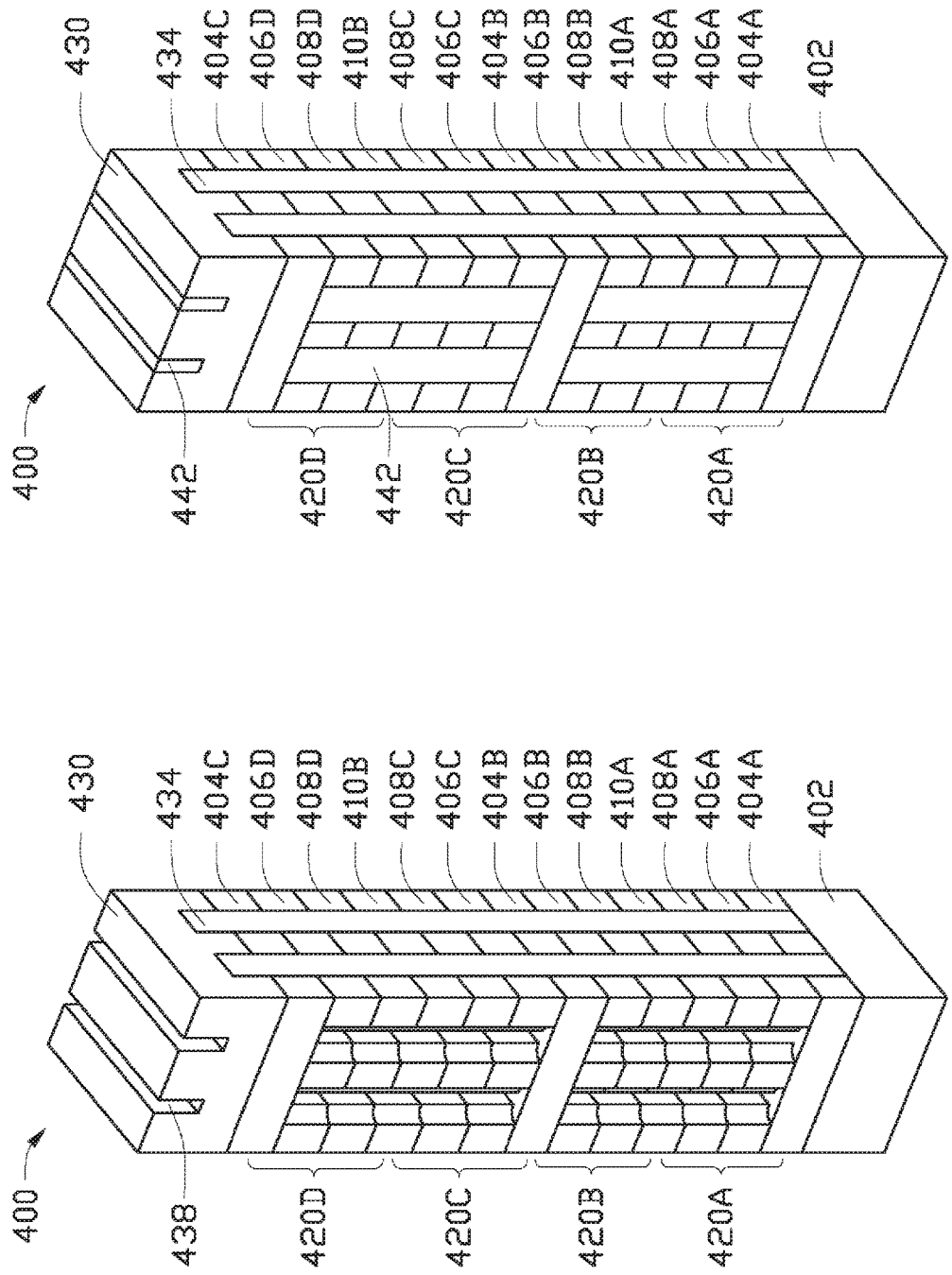

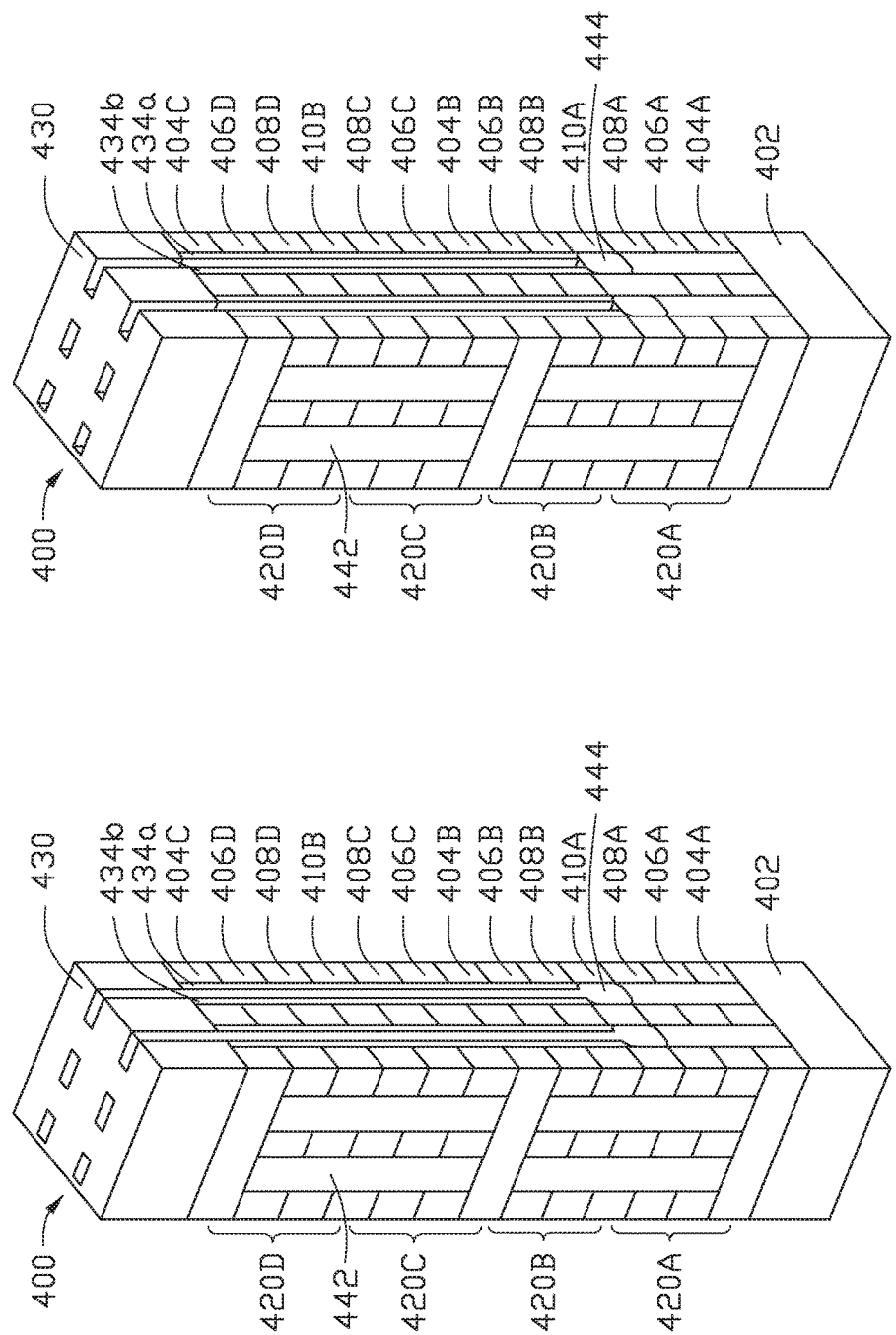

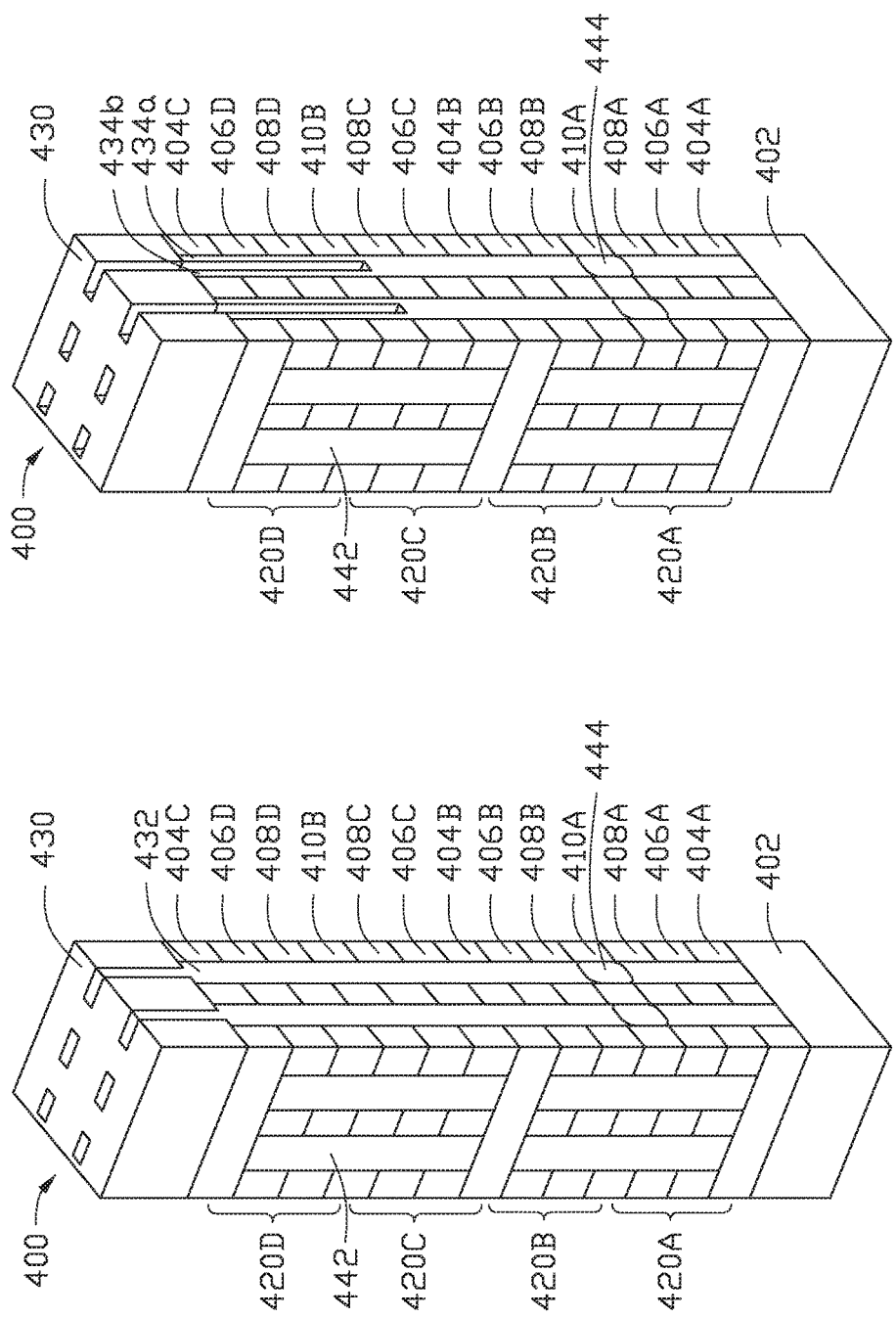

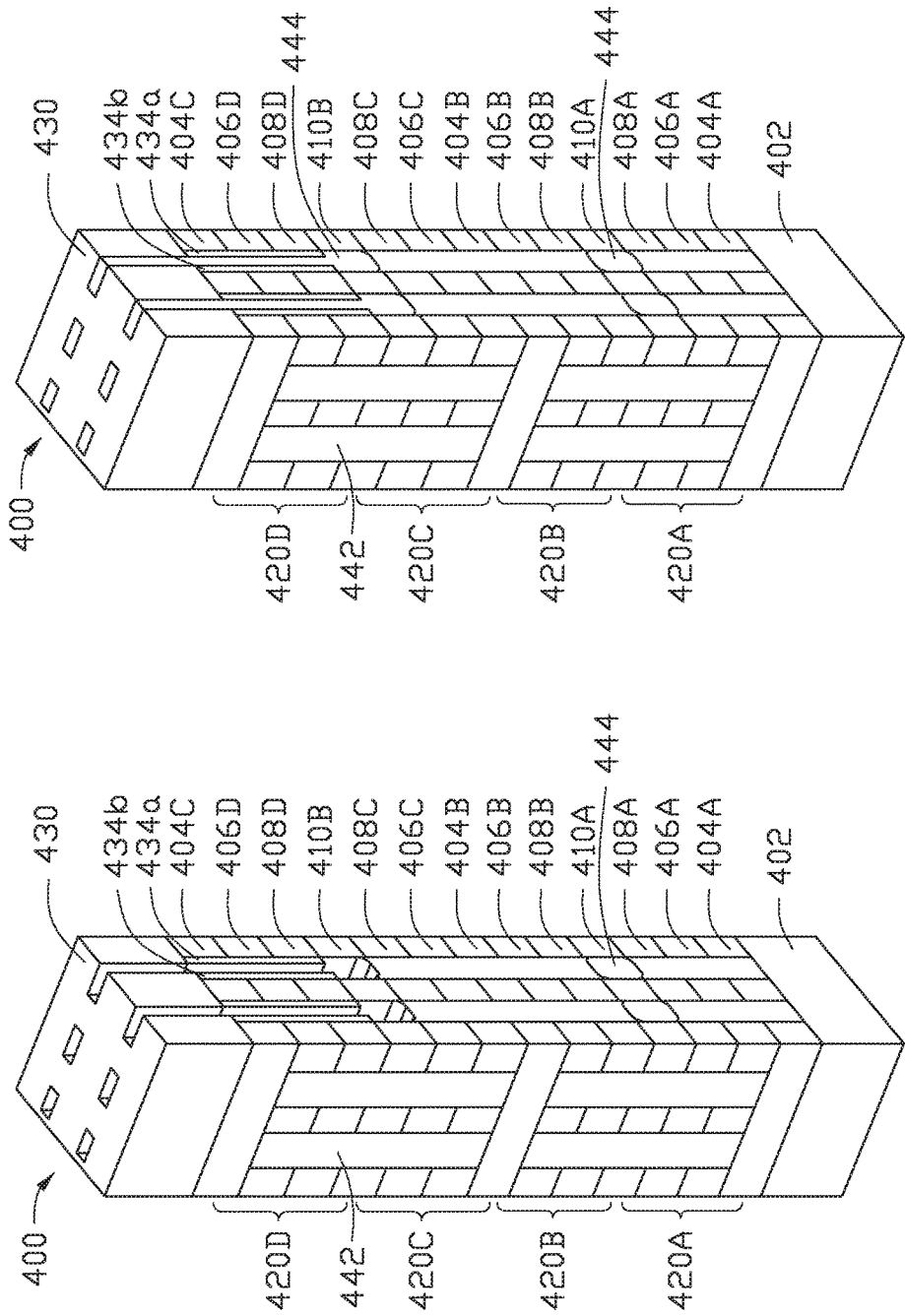

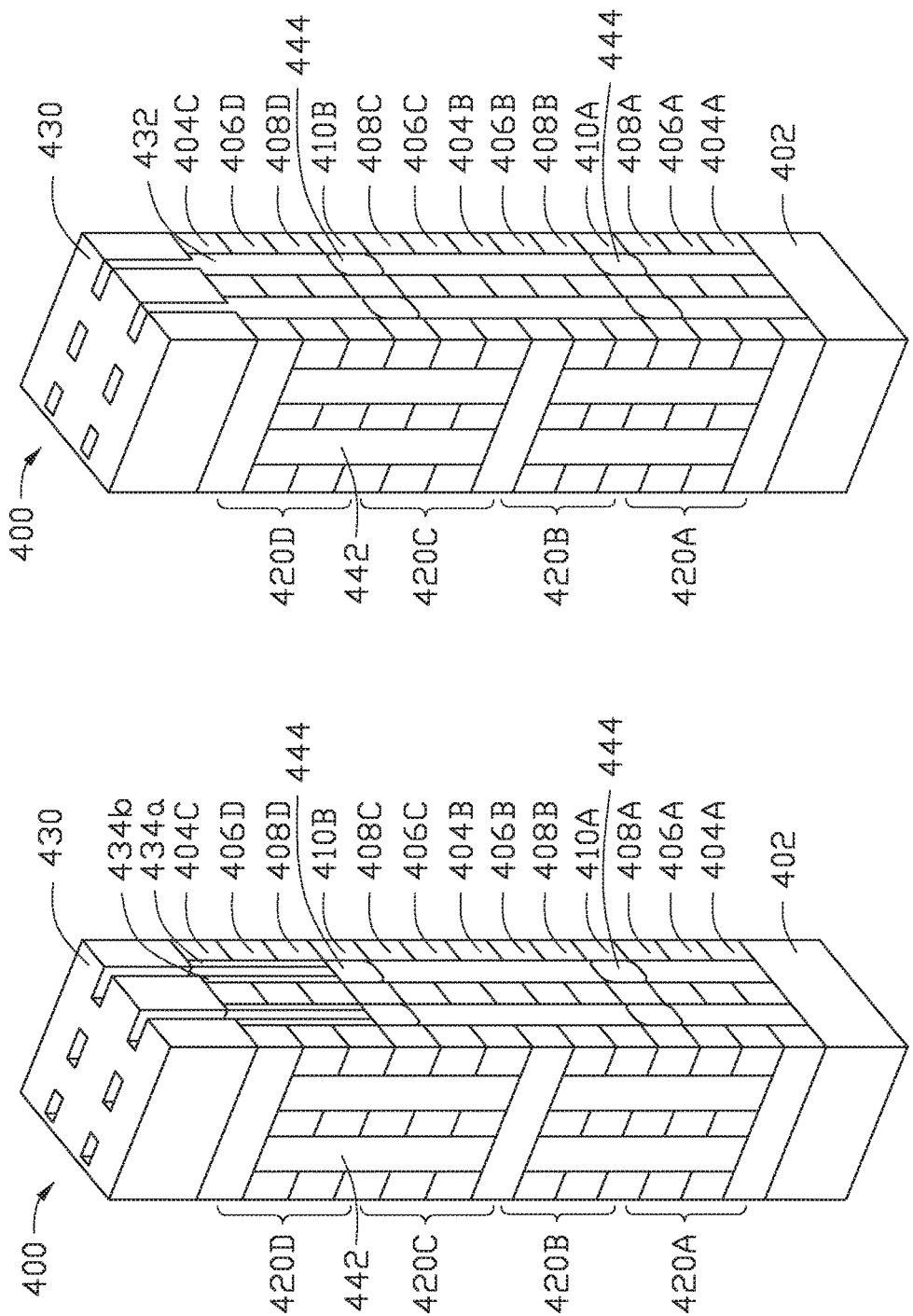

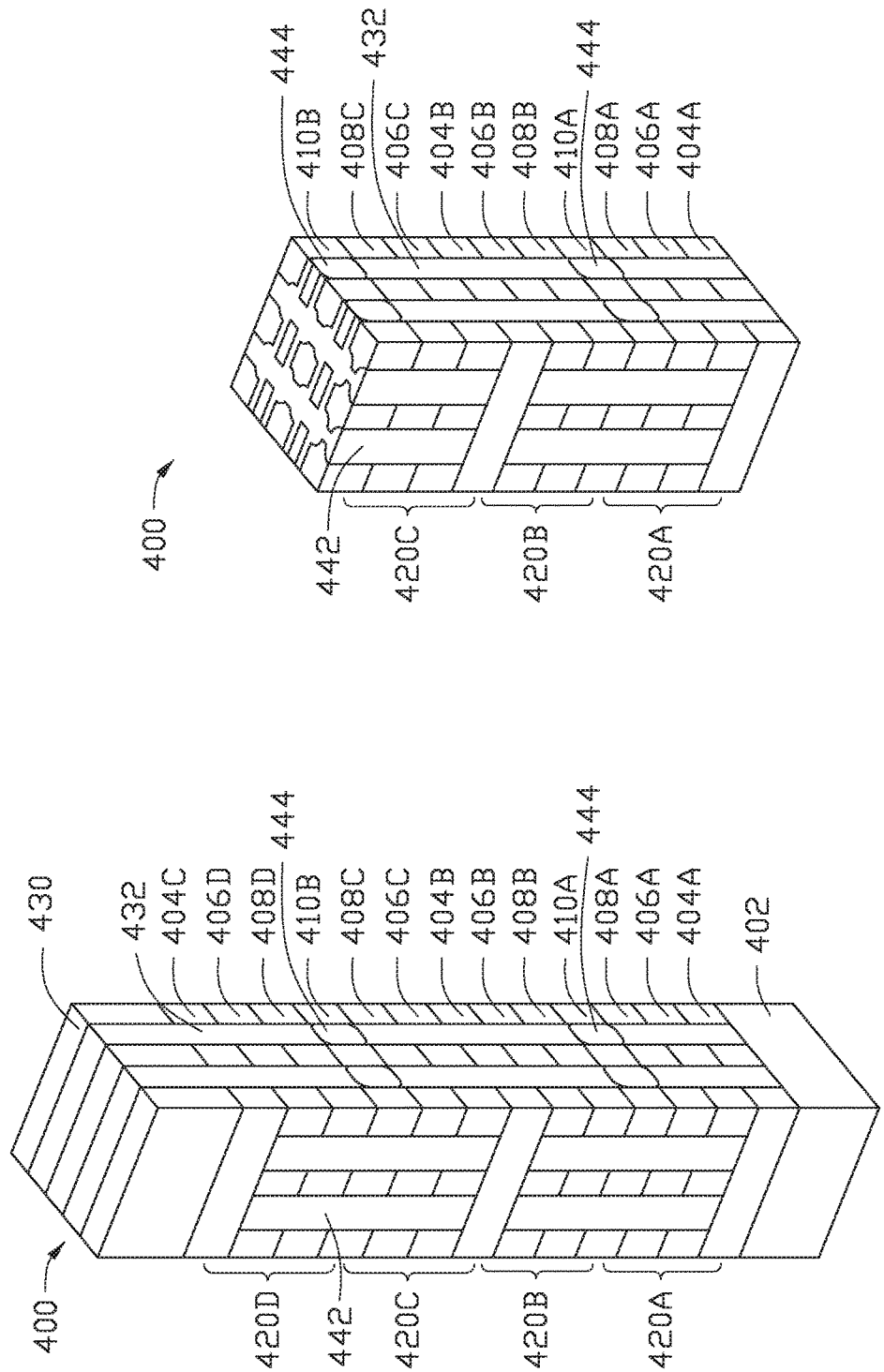

3D CROSS-POINT MEMORY MANUFACTURING PROCESS HAVING LIMITED LITHOGRAPHY STEPS

CROSS-REFERENCE TO RELATED APPLICATIONS

This application is a divisional of co-pending U.S. patent application Ser. No. 15/080,525, filed Mar. 24, 2016, which is herein incorporated by reference.

BACKGROUND OF THE DISCLOSURE

Field of the Disclosure

Embodiments of the present disclosure generally relate to semiconductor manufactured memory devices and methods of manufacture thereof. More specifically, methods for forming a plurality of layers of a 3D cross-point memory array without the need for lithographic patterning at each layer are disclosed.

Description of the Related Art

Semiconductor manufacturing of memory devices allows for high density to be achieved by constructing the arrays of data bits at very small geometries. The memory arrays include memory element layers and selector layers sandwiched between first metal layers and second metal layers, which run orthogonal the first metal layers. A single memory array may include a plurality of each of the aforementioned layers.

Because of the orthogonal orientation, memory arrays are traditionally constructed one layer at a time using a lithography step at each layer to rotate the pattern. Lithographic patterning, however, has its disadvantages. Lithography is the most costly step in a semiconductor manufacturing process, especially when those steps are for patterning the bit lines and words lines of a cross-point memory array at the finest geometry. Furthermore, each lithographic patterning step for each layer of final memory takes time.

Thus, there is a need in the art for an improved method for forming 3D cross-point memory arrays.

SUMMARY OF THE DISCLOSURE

The present disclosure generally relates to semiconductor manufactured memory devices and methods of manufacture thereof. More specifically, methods for forming a plurality of layers of a 3D cross-point memory array without the need for lithographic patterning at each layer are disclosed. The method includes depositing a patterned hard mask with a plurality of first trenches over a plurality of layers. Each of the plurality of first trenches is etched all the way through the plurality of layers. Then the hard mask is patterned with a plurality of second trenches, which runs orthogonal to the plurality of first trenches. Selective undercut etching is then used to remove each of the plurality of layers except the orthogonal metal layers from the plurality of second trenches, resulting in a 3D cross-point array with memory material only at the intersections of the orthogonal metal layers.

In one embodiment, a memory device is disclosed. The memory device includes a plurality of layers, a plurality of first trenches, and a plurality of second trenches. The plurality of layers includes a first metal layer, a selector layer, a memory element layer, and a second metal layer. The first metal layer includes a first metal material. The second metal layer includes a first portion and a second portion. The second portion includes a second metal material. The plurality of first trenches extends through the plurality of layers. Each of the plurality of first trenches is filled with a first dielectric material and the second portion is disposed in each of the plurality of first trenches. The second portion has rounded edges and a top surface that is coplanar with a top surface of the first portion and a bottom surface that is coplanar with a bottom surface of the first portion. The plurality of second trenches extends through the selector layer, the memory element layer, and the second metal layer. Each of the plurality of second trenches is filled with a second dielectric material and the plurality of second trenches runs orthogonal the plurality of first trenches.

In another embodiment, a method is disclosed. The method includes depositing a plurality of layers on a substrate, depositing a first amount of hard mask material over the plurality of layers, forming a plurality of first trenches in the hard mask material, etching the plurality of first trenches down to the substrate, filling the plurality of first trenches with a first dielectric material, etching the first dielectric material to a level below a top surface of the hard mask material, depositing a second amount of hard mask material over the first amount of hard mask material and the first dielectric material, forming a plurality of second trenches in the hard mask material that runs orthogonal to the plurality of first trenches, and etching a plurality of holes between the plurality of first trenches and the plurality of second trenches down to the substrate.

In another embodiment, a method is disclosed. The method includes depositing a plurality of layers on a substrate. The plurality of layers includes a first metal layer, a selector layer, a memory element layer, and a second metal layer. The first metal layer includes a first metal material. The second metal layer includes a second metal material. The method then includes depositing a first amount of hard mask material over the plurality of layers. The first amount of hard mask material has a plurality of first trenches, a plurality of second trenches and a plurality of holes between the plurality of first trenches and the plurality of second trenches. The plurality of first trenches is filled with a first dielectric material. The plurality of second trenches runs orthogonal to the plurality of first trenches. The method further includes filling the plurality of holes and the plurality of second trenches with a second dielectric material, depositing a second amount of hard mask material over the first amount of hard mask material and the first dielectric material, planarizing the second hard mask material down to expose a top surface of the first dielectric material, etching the first dielectric material to a level coplanar with a top surface of the second metal layer, depositing a third amount of hard mask material over the second amount of hard mask material, etching the first dielectric material down to a bottom surface of the second metal layer, and laterally etching a first wall and a second wall of the first dielectric material between a top surface and the bottom surface of the second metal layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to semiconductor manufactured memory devices and methods of manufacture thereof. More specifically, methods for forming a plurality of layers of a 3D cross-point memory array without the need for lithographic patterning at each layer are disclosed. In one embodiment, the method includes depositing a patterned hard mask with a plurality of first trenches over a plurality of layers. Each of the plurality of first trenches is etched all the way through the plurality of layers. Then the hard mask is patterned with a plurality of second trenches, which runs orthogonal to the plurality of first trenches. Selective undercut etching is then used to remove each of the plurality of layers except the orthogonal metal layers from the plurality of second trenches, resulting in a 3D cross-point array with memory material only at the intersections of the orthogonal metal layers.

Figure 1:
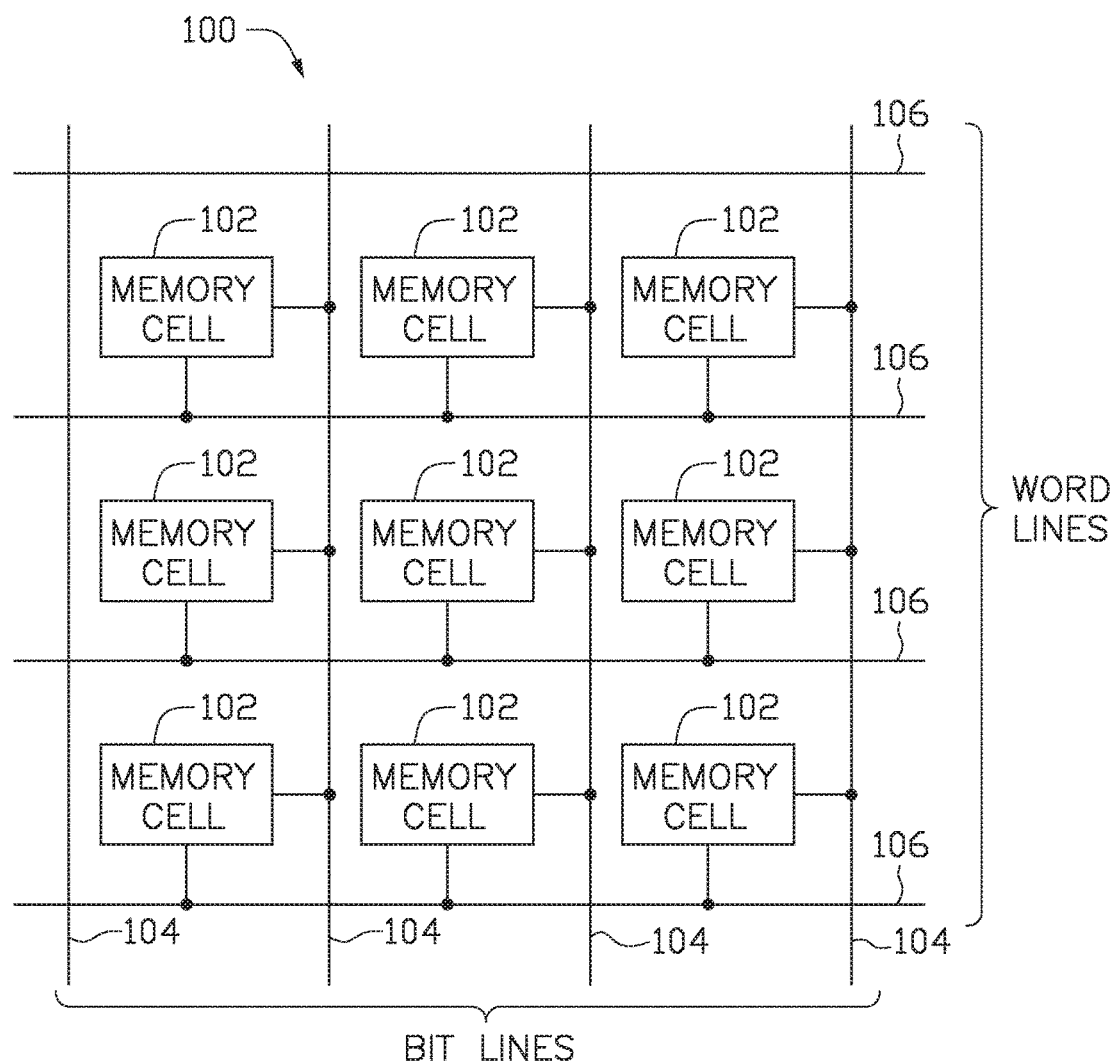
FIG. 1 is a schematic diagram of a memory array according to one embodiment described herein.

FIG. 1 is a schematic diagram of a memory array 100 according to one embodiment described herein. The memory array 100 includes a plurality of memory cells 102, a first plurality of parallel lines 104 and a second plurality of parallel lines 106. The first plurality of parallel lines 104 runs orthogonal to the second plurality of parallel lines 106. The first plurality of parallel lines 104 may represent bit lines and the second plurality of parallel lines 106 may represent word lines. Each memory cell 102 is coupled to a bit line 104 and a word line 106. Co-linear memory cells 102 are coupled to one common line and one line not in common with the other co-linear memory cells 102.

Figure 2:
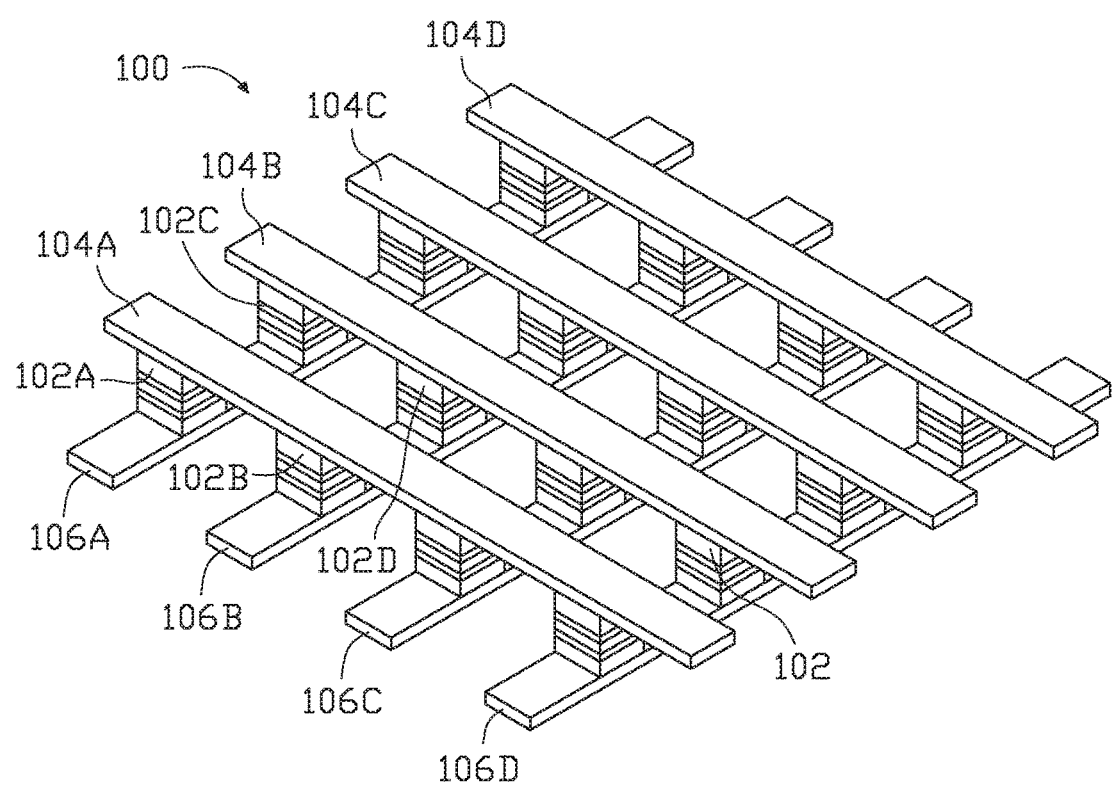
FIG. 2 is a schematic perspective view of the memory array according to one embodiment described herein.

FIG. 2 is a schematic perspective view of the above described memory array 100 according to one embodiment described herein. The first plurality of parallel lines 104 is disposed in a common plane. The second plurality of parallel lines 106 is disposed in a common plane spaced above the first plurality of parallel lines 104. The memory array 100 is arranged such that a first memory cell 102A is coupled to a first line 104A of the first plurality of parallel lines 104. The first memory cell 102A is also coupled to a first line 106A of the second plurality of parallel lines 106. A second memory cell 102B is coupled to the first line 104A and a second line 106B of the second plurality of parallel lines 106. A third memory cell 102C is coupled to a second line 104B of the first plurality of parallel lines 104. The third memory cell 102C is also coupled to the first line 106A. A fourth memory cell 102D is coupled to both the second line 104B and second line 106B. It is to be understood that while four lines 104A-104D of the first plurality of parallel lines 104 are shown, more or less lines may be present. Additionally, it is also to be understood that while four lines 106A-106D are shown of the second plurality of parallel lines 106, more or less lines may be present.

Figure 3:
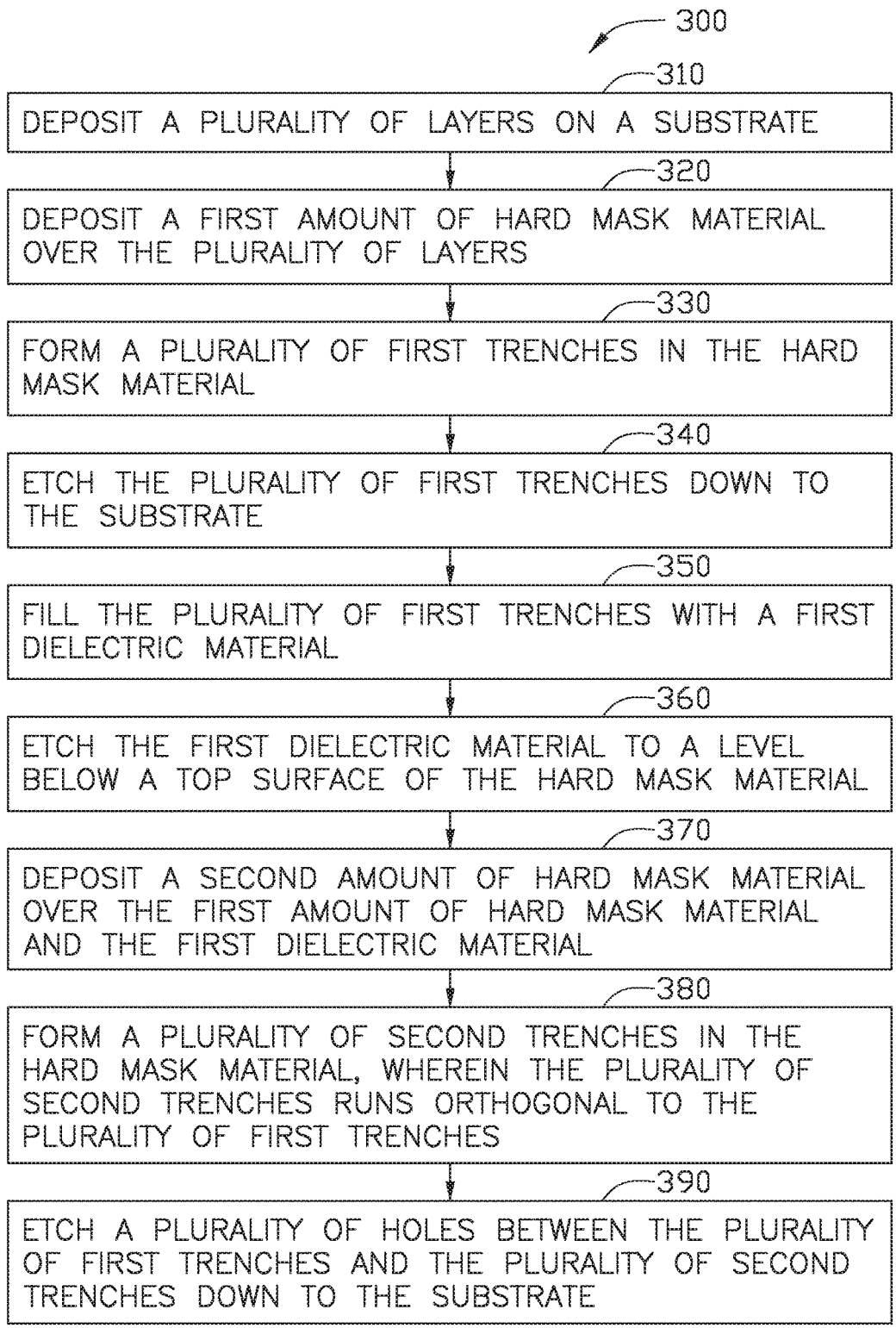
FIG. 3 illustrates operations of a method for forming a 3D cross-point memory array according to embodiments described herein.
Figure 4L:
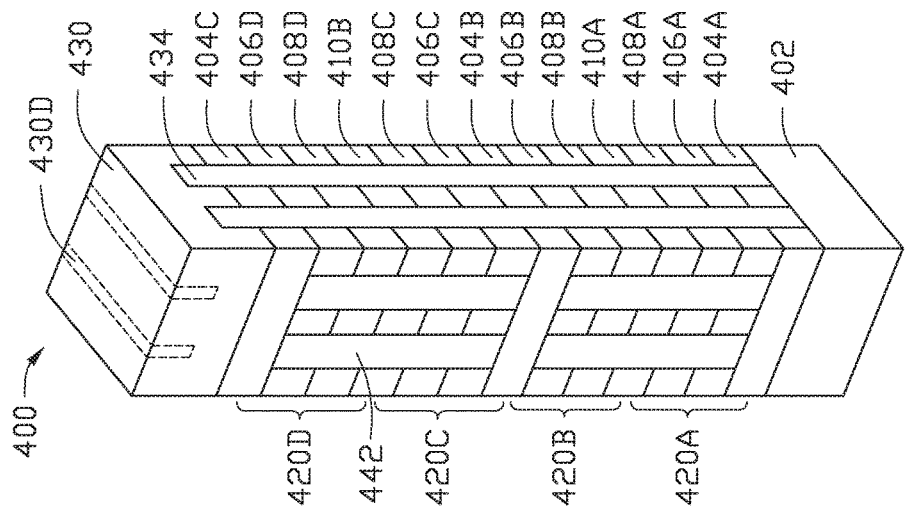
FIGS. 4A-4AA depict a 3D cross-point memory array at various stages of the methods described herein.

FIG. 3 illustrates operations of a method 300 for forming a 3D cross-point memory array according to embodiments described herein. FIGS. 4A-4AA depict a 3D cross-point memory array 400 at various stages of the methods described herein. The method 300 begins at operation 310 by depositing a plurality of layers on a substrate 402, as shown in FIG. 4A. The plurality of layers includes at least a first metal layer 404A, a selector layer 406A, a memory element layer 408A, and a second metal layer 410A. In other words, for each layer of final memory, at least one of the first metal layer 404 or the second metal layer 410, the selector layer 406 and the memory element layer 408 must be deposited. FIG. 4A shows four final memory layers 420A, 420B, 420C, and 420D.

The first metal layer 404 comprises a first metal material having a first etch rate. In one example, the first metal material may be Physical Vapor Deposition (PVD) Tungsten. The second metal layer 410 comprises a second metal material having a second etch rate. In one example, the second metal material may be Titanium Nitride. In one embodiment, the first metal material may become a bit line and the second metal material may become a word line. In another embodiment, the first metal material may become a word line and the second metal material may become a bit line.

At operation 320 a first amount of hard mask material 430A is deposited over the plurality of layers. The first amount of hard mask material 430A may be thick enough to survive all of the etch steps the methods described herein.

At operation 330, a plurality of first trenches 432 (two are shown) is formed in the hard mask material 430A, as shown in FIG. 4B. At operation 340, each of the plurality of first trenches 432 is etched down to the substrate 402, as shown in FIG. 4C. In one example, the plurality of first trenches 432 may be etched down to the substrate 402 using a reactive ion etch (RIE). At operation 350, each of the plurality of first trenches 432 is filled with a first dielectric material 434. Filling each of the plurality of first trenches 432 may include spin-on glass followed by high pressure anneal. The first dielectric material 434 may be any suitable dielectric material. The method 300 may further include planarizing the surface using chemical-mechanical planarization.

At operation 360 the first dielectric material 434 is etched to a level below a top surface of the hard mask material 430A, as shown in FIG. 4E. At operation 370, a second amount of hard mask material 430B is deposited over the first amount of hard mask material 430A and the first dielectric material 434, as shown in FIG. 4F. In other words, the recess in the first dielectric material 434 is filled with the second amount of hard mask material 430B. The method 300 may further include planarizing the surface of the second amount of hard mask material 430B.

At operation 380, a plurality of second trenches 438 (two are shown) is formed in the hard mask material 430, as shown in FIG. 4G. The plurality of second trenches 438 run orthogonal to the plurality of first trenches 432. A plurality of holes 440 (two are shown) are formed between the plurality of first trenches 432 and the plurality of second trenches 438. At operation 390, each of the plurality of holes 440 between the plurality of first trenches 432 and the plurality of second trenches 438 is etched down to the substrate 402.

The method 300 may then include depositing a third amount of hard mask material 430C over the second amount of hard mask material 430B, as shown in FIG. 4H. The deposition of the third amount of hard mask material 430C may reduce the sizes of the plurality of second trenches 438 by about fifty percent. The dashed line represents the thickness of the third amount of hard mask material 430C.

Next, the method 300 may include undercut etching the selector layer 406 (four are shown as 406A, 406B, 406C, 406D), the memory element layer 408 (four are shown as 408A, 408B, 408C, 408D), and the second metal layer 410 (two are shown 410A, 410B), as shown in FIG. 4I. In other words, undercut etching may be used to undercut etch everything but the first dielectric material 434 and the first metal layer 404 (three are shown 404A, 404B, 404C). In one example, the undercut etching may be performed using an isotropic etchant, such as nitric acid.

The plurality of holes 440 and the plurality of second trenches 438 (i.e. the undercut areas) may then be filled with a second dielectric material 442, as shown in FIG. 4J. The second dielectric material 442 may be any suitable dielectric material. In one example the first dielectric material 434 and the second dielectric material 442 may include different dielectric materials. In another example, the first dielectric material 434 and the second dielectric material 442 may include the same dielectric material. The second dielectric material 442 may optionally be etched, refilled and planarized to address any potential gaps or keyholes which may have formed during the undercut etching.

Figure 4K:
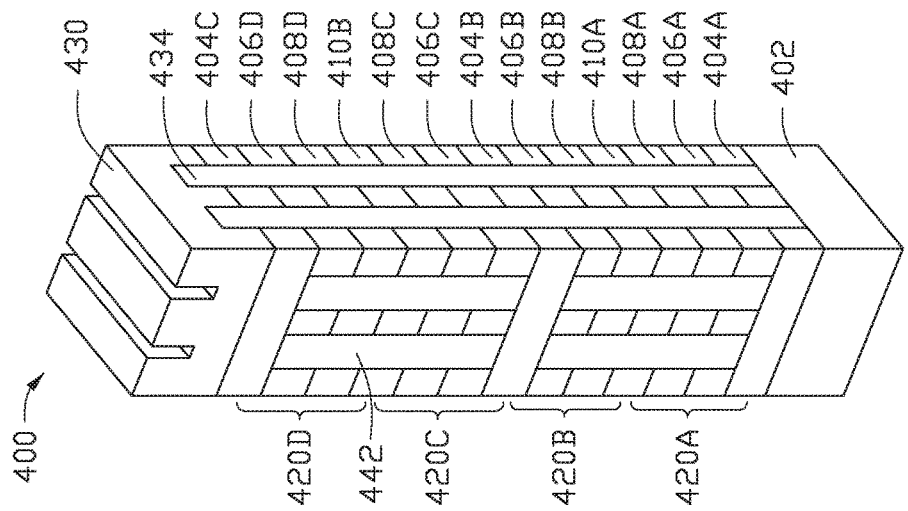

Next, the second dielectric material 442 in the plurality of second trenches 438 may be etched to a depth about equal to the thickness of the first hard mask material 430A, as shown in FIG. 4K. A fourth amount of hard mask material 430D may then be deposited over the third amount of hard mask material 430C, as shown in FIG. 4L. Then, the fourth amount of hard mask material 430D may be planarized down to expose a top surface of the first dielectric material 434, as shown in FIG. 4M.

Figure 4N:
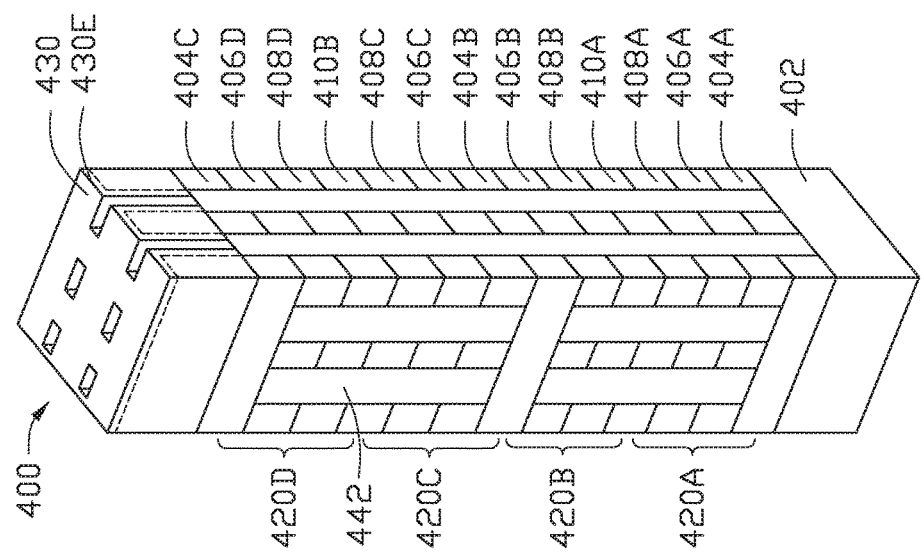
Figure 4M:
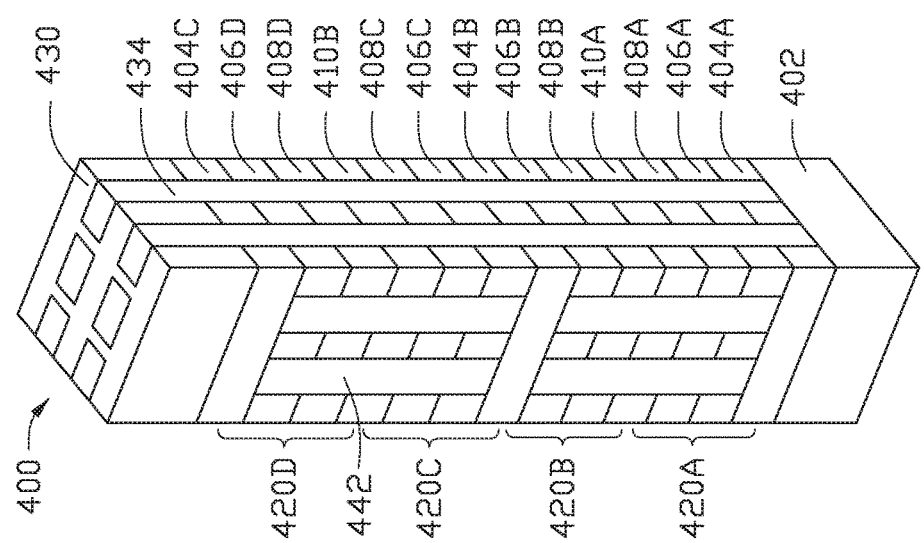

As shown in FIG. 4N, the first dielectric material 434 may be etched down to a bottom surface of the hard mask material 430 and a fifth amount of hard mask material 430E may be deposited over the fourth amount of hard mask material 430D to narrow the width of the plurality of first trenches 432. The dashed line represents the thickness of the fifth amount of hard mask material 430E.

Figures 4O, 4P:
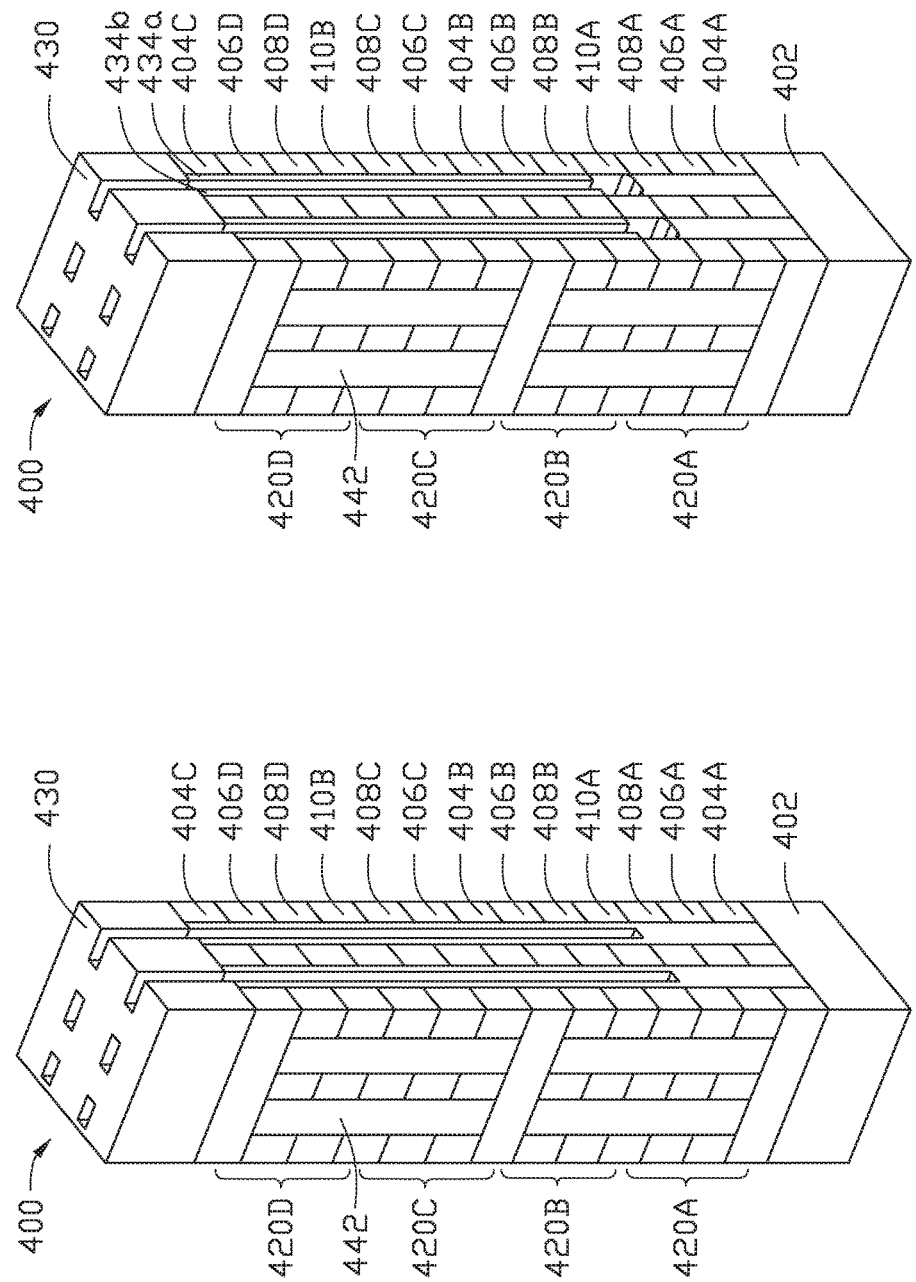
Figure 4A:
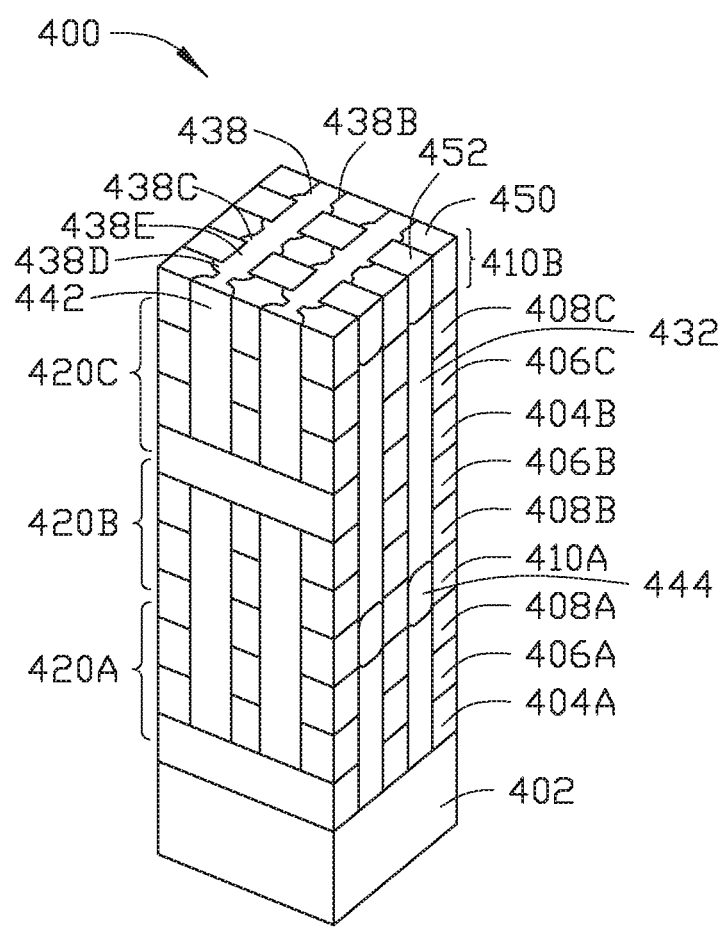

Next, the first dielectric material 434 may be etched down to a bottom surface of the second metal layer 410A, as shown in FIG. 4O. The etching of the first dielectric material 434 may be performed by time stop etching in order to ensure that the etch stops at the bottom surface of the second metal layer 410A. Footprint etching occurs at the bottom of the etched first dielectric material 434 such that a first wall 434A and a second wall 434B of the first dielectric material 434 are laterally etched between a top surface and the bottom surface of the second metal layer 410A, as shown in FIG. 4P. Each of the plurality of first trenches 432 is then filled with the second metal material 444, as shown in FIG. 4Q. The second metal material 444 is then etched down to the stop surface of the second metal layer 410A, as shown in FIG. 4R.

The aforementioned steps may be repeated until the second metal material 444 is disposed at every second metal layer 410. More specifically, as shown in FIG. 4S, the plurality of first trenches 432 may be refilled with the first dielectric material 434. The first dielectric material 434 may then be etched down to a bottom surface of the second metal layer 410B, as shown in FIG. 4T. Once again, footprint etching occurs at the bottom of the etched first dielectric material 434 such that the first wall 434A and the second wall 434B of the first dielectric material 434 are laterally etched between a top surface and the bottom surface of the second metal layer 410B, as shown in FIG. 4U. Each of the plurality of first trenches 432 is then filled with the second metal material 444, as shown in FIG. 4V. The second metal material 444 is then etched down to the stop surface of the second metal layer 410B, as shown in FIG. 4W. Then, each of the plurality of first trenches 432 is refilled with the first dielectric material 434, as shown in FIG. 4X. The hard mask material 430 may then be removed, such that the top surface is then the first metal layer 404C and the first dielectric material 434, as shown in FIG. 4Y. A third dielectric material may optionally be deposited over the plurality of layers. The 3D cross-point memory array 400 may then be planarized to remove the first metal layer 404C, as shown in FIG. 4Z, leaving portions of the second metal layer 410B and the first dielectric material 434 and the second dielectric material 442. Additional planarization may be used such that none of the first dielectric material 434 remains on the top surface of the 3D cross-point memory array 400, as shown in FIG. 4AA.

In an alternative embodiment, starting with the 3D cross-point array 400 as shown in FIG. 4Q, each of the plurality of first trenches 432 is filled with a third metal material instead of the second metal material 444. The third metal material may include a high aspect ratio and low temperature deposition of a thin Tungsten Nitride and a Chemical Vapor Deposition (CVD) Tungsten. The third metal material may then be etched down using a selective dry etch.

The methods described herein result in a 3D cross-point memory array 400 shown in FIG. 4AA. The 3D cross-point memory array 400 of FIG. 4AA includes three final memory layers 420A, 420B, and 420C. More specifically, the 3D cross-point memory array 400 includes at least the first metal layer 404B, the selector layer 406B, the memory element layer 408B, and the second metal layer 410B. The 3D cross-point memory array 400 also includes the plurality of first trenches 432 and the plurality of second trenches 438, which run orthogonal to one another.

The plurality of first trenches 432 extends through the plurality of layers of at least the final memory layer 420C. Each of the plurality of first trenches 432 is filled with a first dielectric material 434. Each of the plurality of second trenches 438 extends through at least the first metal layer 410B, the selector layer 406C and the memory element layer 408C. Each of the plurality of second trenches 438 does not extend through the first metal layer 404B. Each of plurality of second trenches 438 is filled with a second dielectric material 442.

The first metal layer 404B includes the first metal material. The second metal layer 410B includes at least a first portion 450 and a second portion 452. In one embodiment, the first portion 450 and the second portion 452 may include the second metal material 444. In another embodiment, the second portion 452 may include the second metal material 444 and the first portion 450 may include the third metal material. The second portion 452 is disposed in each of the plurality of first trenches 432 such that a top surface of the second portion 452 is coplanar with a top surface of the first portion 450 and a bottom surface that is coplanar with a bottom surface of the first portion 450. The second portion 452 has rounded edges.

The first wall 432A and the second wall 432B of each of the plurality of first trenches 432 are linear and parallel such that the width of each of the plurality of trenches 432 is consistent along the length of each of the plurality of first trenches 432. However, a first wall 438A and a second wall 438B of each of the plurality of second trenches 438 are non-linear. Instead, each of the plurality of second trenches 438 has at least a first convex portion 438C and a second convex portion 438D, which are connected by a rectangular portion 438E. The width of the rectangular portion 438E of each of the plurality of second trenches 438 is less than the width of the first convex portion 438C and the second convex portion 438D.

The first metal layer 404B may include Tungsten. The selector layer 406B may include an ovonic threshold switch (OTS) material. The memory element layer 408B may include in information storage material, such as resistive random access memory (RAM). The first portion 450 may include Titanium Nitride. The second portion 452 may include Titanium Nitride. In another example, the second portion 452 may include Tungsten Nitride and CVD Tungsten.

After the 3D cross-point memory array 400 has been constructed using the methods described herein, a plurality of vias may be formed between the first metal layers 404A, 404B, 404C and the second metal layers 410A, 410B such that the 3D cross-point memory array 400 may contact the substrate 402.

Benefits of the present disclosure include manufacturing a 3D cross-point memory array by depositing two or more of the three-layer stacks and then etching them all together following a single lithography patterning step. These methods result in cost-efficient and time-efficient production of memory devices having very fine geometries.

In summation, the present disclosure generally relates to semiconductor manufactured memory devices and methods of manufacture thereof. More specifically, methods for forming a plurality of layers of a 3D cross-point memory array without the need for lithographic patterning at each layer are disclosed. The method includes depositing a patterned hard mask with a plurality of first trenches over a plurality of layers. Each of the plurality of first trenches is etched all the way through the plurality of layers. Then the hard mask is patterned with a plurality of second trenches, which runs orthogonal to the plurality of first trenches. Selective undercut etching is then used to remove each of the plurality of layers except the orthogonal metal layers from the plurality of second trenches, resulting in a 3D cross-point array with memory material only at the intersections of the orthogonal metal layers.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
depositing a plurality of layers on a substrate;
forming a hard mask layer comprising a hard mask material over the plurality of layers;
forming a plurality of first trenches through the hard mask layer;
etching the plurality of first trenches down to the substrate;
filling the plurality of first trenches with a first dielectric material;
etching the first dielectric material to a level above a bottom surface of the hard mask layer;
depositing the hard mask material over a top surface of the first dielectric material;
forming a plurality of second trenches in the hard mask layer, wherein the plurality of second trenches are formed to run orthogonal to the plurality of first trenches; and
etching a plurality of holes between the plurality of first trenches and the plurality of second trenches down to the substrate.

2. The method of claim 1, wherein the plurality of layers comprise:
a first metal layer comprising a first metal material;
a selector layer;
a memory element layer; and
a second metal layer comprising a second metal material.

3. The method of claim 2, wherein the first metal material comprises Tungsten.

4. The method of claim 2, wherein the selector layer comprises an ovonic threshold switch material.

5. The method of claim 2, wherein the second metal material comprises titanium nitride.

6. The method of claim 2, further comprising:
forming the plurality of second trenches within the selector layer, the memory element layer, and the second metal layer;
filling the plurality of holes and the plurality of second trenches formed within the selector layer, the memory element layer, and the second metal layer with a second dielectric material; and
filling the plurality of second trenches formed in the hard mask layer with the hard mask material.

7. The method of claim 6, wherein the plurality of second trenches are formed within one or more of the selector layer, memory element layer, and second metal layer by undercut etching.

8. The method of claim 6, further comprising:
planarizing the hard mask layer to expose the top surface of the first dielectric material;
removing the first dielectric material from the first trenches formed in the hard mask layer;
narrowing a width of the first trenches formed through the hard mask layer;
etching the first dielectric material down to a bottom surface of the second metal layer through the hard mask layer;
removing remaining first dielectric material between a top surface and the bottom surface of the second metal layer;

filling the plurality of first trenches with a third metal material; and etching the third metal material down to the top surface of the second metal layer.

9. The method of claim 8, wherein the third metal material comprises one or more of: the second metal material, Tungsten Nitride, and Tungsten.

10. The method of claim 8, further comprising:
removing the hard mask material; and
depositing a third dielectric material over a top surface of the plurality of layers.

11. The method of claim 10, further comprising:
planarizing the top surface of the plurality of layers.

12. The method of claim 8, wherein narrowing the width of the first trenches formed through the hard mask layer comprises depositing an additional hard mask material over the hard mask layer.

13. The method of claim 8, wherein removing the remaining first dielectric material comprises laterally etching a first wall and a second wall of the first dielectric material between the top surface and the bottom surface of the second metal layer.

14. A method, comprising:
depositing a plurality of layers on a substrate, wherein the plurality of layers comprise:
a first metal layer comprising a first metal material;
a selector layer;
a memory element layer; and
a second metal layer comprising a second metal material;
depositing hard mask material over the plurality of layers, wherein a plurality of first trenches filled with a first dielectric material extend from a level below a top surface of the hard mask material down through the plurality of layers, wherein a plurality of second trenches run orthogonal to the plurality of first trenches and comprise second trenches formed above the first trenches in the hard mask material, and wherein a plurality of holes are formed between the plurality of first trenches and the plurality of second trenches;
filling the plurality of holes and the plurality of second trenches with a second dielectric material;
planarizing the hard mask material down to expose the first trenches;
etching the first dielectric material from the first trenches to a level coplanar with a top surface of the first metal layer;
increasing a thickness of the hard mask material;
etching the first dielectric material down to a bottom surface of the second metal layer; and
laterally etching a first wall and a second wall of the first dielectric material between a top surface and the bottom surface of the second metal layer.

15. The method of claim 14, further comprising:
filling the plurality of first trenches with a third metal material; and
etching the third metal material down to the top surface of the second metal layer.

16. The method of claim 15, wherein the third metal material comprises one or more of Tungsten Nitride and Tungsten.

17. The method of claim 15, further comprising:
removing the hard mask material.

18. The method of claim 17, further comprising:
depositing a third dielectric material over a top surface of the plurality of layers; and
planarizing the top surface of the plurality of layers.

19. The method of claim 14, further comprising:
forming a plurality of vias between the first metal layer and the second metal layer.

20. The method of claim 14, wherein depositing the hard mask material over the first metal layer comprises:
depositing a first amount of the hard mask material over the first metal layer;
forming the first trenches through the first amount of the hard mask material;
etching the first dielectric material down to the level below a top surface of the first amount of the hard mask material; and
depositing a second amount of the hard mask material over the first amount of the hard mask material and the first dielectric material.

* * * * *